(12) United States Patent
Hauenstein

(10) Patent No.: US 7,834,575 B2
(45) Date of Patent: Nov. 16, 2010

(54) GATE-DRIVER IC WITH HV-ISOLATION, ESPECIALLY HYBRID ELECTRIC VEHICLE MOTOR DRIVE CONCEPT

(75) Inventor: Henning M Hauenstein, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 182 days.

(21) Appl. No.: 12/080,176

(22) Filed: Apr. 1, 2008

(65) Prior Publication Data
US 2009/0243764 A1    Oct. 1, 2009

(51) Int. Cl.
*G05B 19/18* (2006.01)
(52) U.S. Cl. .................. 318/569; 318/600; 388/907.5; 257/500; 257/506
(58) Field of Classification Search .............. 318/569, 318/600; 388/907, 907.5; 257/499, 500, 257/501, 506
See application file for complete search history.

(56) References Cited
U.S. PATENT DOCUMENTS

| | | | | |
|---|---|---|---|---|
| 4,929,884 A | * | 5/1990 | Bird et al. ............... | 323/313 |
| 5,736,774 A | * | 4/1998 | Fujihira ................... | 257/500 |
| 6,323,539 B1 | * | 11/2001 | Fujihira et al. ........... | 257/630 |
| 6,717,828 B2 | * | 4/2004 | Iwagami et al. .......... | 363/56.03 |
| 2005/0146823 A1 | * | 7/2005 | Sakata et al. ............. | 361/100 |
| 2005/0152080 A1 | * | 7/2005 | Harris et al. .............. | 361/56 |

* cited by examiner

*Primary Examiner*—Rina I Duda
(74) *Attorney, Agent, or Firm*—Farjami & Farjami LLP

(57) ABSTRACT

An automotive drive system for a high voltage electric motor comprises a microcontroller and ECU powered by a low voltage (12 volt) bus net which controls the drives of a high voltage inverter powered by a 100 volt or higher source, which, in turn, drives the motor. To provide good electrical insulation between the low voltage and high voltage systems, the low voltage control signals are produced by a low voltage signal input chip which has a bottom electrode which produces a control potential responsive to the ECU output and a high voltage driver IC which drives the power devices of the high voltage inverter. The high voltage driver IC has a top electrode which drives the high voltage IC function. The bottom electrode of the LV input chip is coupled to the top electrode of the high voltage driver IC through an insulation layer, defining a capacitive coupler which defines an isolation barrier between the low voltage net and the high voltage system insulation. The two ICs may be bare chips, individually packaged chips or co-packed chips. Plural control IC chips and driver IC chips can communicate with one another for diverse control functions, including "smart" functions.

20 Claims, 8 Drawing Sheets

FIG. 7 (LV Input Device)

GATE-DRIVER IC WITH HV-ISOLATION, ESPECIALLY HYBRID ELECTRIC VEHICLE MOTOR DRIVE CONCEPT

RELATED APPLICATIONS

This application is related to copending application Ser. No. 11/676,029, filed Feb. 16, 2007 in the name of Michael A. Briere (IR-2724) and copending application Ser. No. 12/009,721, filed Jan. 22, 2008 in the name of Henning Hauenstein (IR-3522) each of which are assigned to the assignee of this application.

FIELD OF THE INVENTION

This invention relates to the drive of high voltage semiconductor circuits from a low voltage integrated circuit with high voltage insulation between the two circuits.

BACKGROUND OF THE INVENTION

There is an increasing demand for the management of high currents in a very small space and in harsh environments exposed to large temperature changes. Thus, in the automotive sector, due to increasing electrification functions, the high current demand increases enormously as for inverter and E-motor drives in hybrid car applications, starter-generator applications, and high power DC/DC converters or x-by-wire applications used for electric power steering or electric braking. These applications have high current carrying requirements in a minimum space, challenging state-of the art power modules in terms of achievable power density.

In order to provide sufficiently high power energy sources, the typical 12V automotive battery power net would require currents of about one hundred amperes up to thousands amperes. Thus a 42V power net has been employed to provide higher power while keeping the current at reasonable values, in the range of 100 amperes in order to reduce cable thickness and conduction losses ($I^2R$).

Hybrid electric vehicles ("HEV") have now entered the automotive market. Equipped with huge electric motors such cars can be operated without the combustion engine. These E-motors are typically in the power range of 15 kW to over 100 kW. Correspondingly the voltage of the power source driving these motors had to be increased beyond the 12V net. Then, even 42V was not enough to keep the phase currents of those high power motors and applications to a reasonable order of magnitude.

Therefore, HEVs are equipped with a so called dual power net or dual bus voltage system. Conventional electric systems are still powered by the 12V battery. However, in order to power the E-Motors and power intensive auxiliary systems a second very high voltage battery has been introduced. This is normally a NiMH or a Li-Ion battery with output voltages of from 150V to over 600V with good energy storage capabilities. Instead of having a 600V battery, a lower voltage battery, e.g. 150-300V can be boosted to 600V or greater via a DC/DC converter.

The existence of a high voltage system in HEVs causes a major challenge: the 12V powered systems need to be well protected from the high voltage system since standard automotive blocking and protection circuits are not dimensioned to withstand more than 30V or 40V. Even the known 42V system specifications do not allow more than 60V in the entire power net due to safety reasons.

With a high voltage source in the car the low voltage (LV) and high voltage (HV) power supplies need to be very well isolated from each other. Otherwise the LV components would immediately be destroyed by accidental direct contact to the HV net. In addition to the electrical damage the HV bus also needs to be secured against accidental contact by humans. Thus, while the 12V battery was relatively safe and not life threatening; an accidental contact to the new HV power net can be deadly. Therefore, the HV power circuit needs to be 100% safe and protected from any accidental contact by humans. Correspondingly it must be assured that the LV power net, which can normally be touched, is well isolated from the dangerous HV circuit.

This isolation problem between the LV and HV bus is quite complicated since the two electric circuits in a car still need to communicate with each other. For example all the microcontrollers and other control elements such as Electric Control Units (ECUs) are integrated in the 12V power net. These microcontrollers and computers determine the various drive modes and control the entire behavior of the overall system. Therefore these microcontrollers need to send commands to the HV control electronics. Specifically, the HV gate driver integrated circuits (ICS) which control the high power motor control electronics need to exchange information and commands from the LV electronics.

FIG. 1 shows a typical E motor drive system for E motor 30. A low voltage microcontroller 32 (and its ECU—not shown) is powered by low voltage battery 31 (12 volts) and controller 32 is coupled to the drivers of a high voltage inverter consisting of IGBTs in three half bridges within dotted box 33. A high voltage battery 40 (600 volts) and filter capacitor 41 powers inverter 33. Each IGBT has a suitable IC driver, shown as high side drivers 34, 35 and 36, and low side drivers 37, 38 and 39 for E motor phases U, V and W. The low voltage system microcontroller 32 must be coupled to the high voltage side of the system to drive as schematically shown by the lines labeled "control signals".

As previously stated, it is necessary to isolate the LV network (shown with the microcontroller and the ECU in block diagrammatic form) from the HV circuit. FIG. 2 schematically illustrates a prior art type of isolation barrier 50, known for such circuits. Typically the isolation should be capable of insulating 2 times the HV bus voltage plus 1 kV. (2200 volts in the case of FIG. 2.) With typical HV bus voltages of greater than about 500 volts, the isolation will be in the range of greater than 2 kV to 4 kV. It has been very difficult to establish such a high isolation which is reliable and rugged enough for harsh automotive conditions.

In FIG. 2, the low voltage system to the left of barrier 50 is powered by the battery 31 in FIG. 1 and includes the mixed signal controller 49 and a related electronic control circuit. Microprocessor 32 and its ECU 42 have the conventional functions as indicated in FIG. 2. Thus, digital outputs to the high side and low side drivers are taken through barrier 50. Current sense resistor 51 is also coupled through barrier 50 and resolver 52 is coupled back through barrier 50 to the digital inputs in the LV microcontroller 50. A temperature sense device 53 in the HV side of the system is similarly coupled back to a temperature sensing input in L.V. control 49.

These connections through the isolation barrier 50 conventionally employ opto-couplers, capacitive couplers, inductive couplers and/or transformers. The signals are exchanged via these couplers which have to provide the kV isolation.

The main disadvantage of such isolation is that each signal connection must be separately isolated.

Therefore, just the gate driver signals for the full bridge inverter requires 6 couplers (3 high side and 3 low side). The sensor signals indicated in FIG. 2 require even more couplers.

Major disadvantages of prior art solution are the cost and the space requirements for those couplers.

In addition, those components must be very reliable, and require very expensive components to withstand the typical "under the hood" requirements of an automotive application over its lifetime. Also, degradation of the isolation layers (e.g. in capacitive couplers) and the degrading in performance of the optics of the opto-couplers is a major concern and the automotive industry has been reluctant to use them. Transformers are, therefore, often preferred but are an expensive and space consuming choice. Therefore it is desirable to find an alternative solution to those prior art couplers.

In order to address some of the above mentioned problems with the signal isolation it is also known to provide on-chip isolation between the HV and LV sections of a single IC. For example, a solution called "core-less transformer on chip" is known. The gate driver IC of that solution provides a transformer structure on a chip, established by integrating metal coils in the semiconductor process. Due to the near proximity of the two transformer coils on one IC no classical "core" is used. The isolation layer is provided by an isolating structure of the semiconductor process, e.g. a nitride or oxide layer. The disadvantage of this coreless-transformer-IC solution is that the kV-isolation fully depends on the integrity and ruggedness of the IC process. Any defect of the isolating layer will connect the LV to the HV section of the power net. Therefore, reliability is a serious concern for this solution. In addition the core-less-transformer structure requires a lot of space in order to guarantee greater than 2 kV isolation. The increased silicon chip area also increases the cost of such a gate driver IC beyond that of the area needed for the gate driver function only.

Copending application Ser. No. 12/009,721 (IR-3522), previously identified, describes a solution to the above problems in which a wireless transmission combination is used as the signal interface between the LV and HV circuit. A gate driver IC in the HV system provides an antenna structure (for receiving and/or transmitting signals) and is powered by the HV supply. In the following this chip is called the HV Driver IC. A second chip (in the following called LV Signal-Transmitter) is physically separated from the main HV driver IC and is powered by the LV power supply. The LV signal transmitter is directly connected to signal pins of the LV controller elements (e.g. microcontrollers, DSPs, other digital ICS) which have to exchange signals with the HV driver IC. This LV signal transmitter also contains an antenna structure for uni- or bidirectional signal transmission.

The two chips are physically separated and isolated to produce the required kV-isolation (2.5 kV for example) and are wirelessly coupled through their antennas. The isolation value will depend on the specific application requirements. Antenna structures are provided within the two chips and are formed in suitable metal layers used in the IC-semiconductor process. The antennas can have various embodiments and may be linear dipole antennas or more complex spirals or circular structures surrounding the IC or parts of it. That solution is described in detail in FIGS. 3 to 6, the details of which are later described.

BRIEF DESCRIPTION OF THE INVENTION

In accordance with the invention, an advanced gate driver is provided which solves the problems mentioned above by combining a LV input device with the HV driver IC via a direct chip-on-chip capacitive connection with kV-isolation capability.

As before, the main driver IC which is connected to the HV power supply and which is directly connected to the power stage of the E-motor (e.g. IGBT-power modules) is called the HV driver IC. A second chip (in the following called LV Input device) is mounted on the HV driver IC via an isolation layer that is capable of the required kV-isolation and capacitively coupled to a corresponding section of the HV driver IC. The LV input device is further directly connected to signal pins of controller elements (e.g. microcontrollers, DSPs, other digital ICS etc.) which have to exchange signals with the HV driver IC. This LV input device transmits the various signals via capacitive coupling to the HV driver IC.

The two chips are physically separated and isolated by the required kV-isolation (2.5 kV for example). The isolation value can be selected, depending on the specific application requirements.

The invention offers the following advantages:
(a) A safe high voltage isolation due to an isolated 2 chop structure.
(b) A flexible and variable isolation value obtained by a mechanical separation of the HV driver IC and the LV input device.
(c) A cost effective solution since the isolation layer is not part of the Si (or other) chips; so that no Si-space is wasted for isolation.
(d) The LV input device can be very small since its main function is the capacitive transmission of various control signals from an LV microcontroller to the HV driver IC and vice versa.
(e) The LV input device and HV driver IC may be assembled in a standard package, e.g., SO-IC package.
(f) By keeping the 2 chips in close proximity to each other the capacitive coupled signal transfer bridges only a very short distance, e.g. a few millimeters, corresponding to the isolation requirement of the 2 chips. A major advantage of the invention is the very strong local focus of the signal coupling so that no excessive EMI or other emission will be generated by this capacitive on-chip-coupling.
(g) By use of a more complex capacitor structure (multi metal pads on the chips) or by mounting several LV input devices on one HV driver IC) several capacitive coupled signal lines can be established to one HV driver IC replacing numerous state-of-the-art stand-alone coupling devices.
(h) The communication can be bi-directional so the HV driver IC can also send signals back to the LV-microcontroller. The HV driver especially can provide status feedback and diagnostics from the HV-motor to the LV-control elements running the operation software. Bi-directional communication is an important feature for smart gate driver ICs such as those of commercial International Rectifier Corporation products like the half bridge driver ICs IR2114, IR2214, IR2630. These types of drivers are a very beneficial embodiment of the HV driver IC according to this invention just by adding the mounting pad and capacitive coupling communication logic.
(i) There is a substantial reduction of components compared to state-of-the-art isolation concepts using opto-, capacitive- or inductive-couplers.
(j) There are reduced space requirements, reduced complexity of the circuit and reduced cost.

The invention can be used in numerous applications in the power management market, especially motor drive applications like hybrid electric vehicle traction motors, generators, electric power steering motors, etc., employing communication between 2 different insulated voltage circuits. The invention can also be employed with non-automotive applications where reliable communication between isolated electric circuits is required.

DETAILED DESCRIPTION OF THE DRAWINGS

Figure 2:
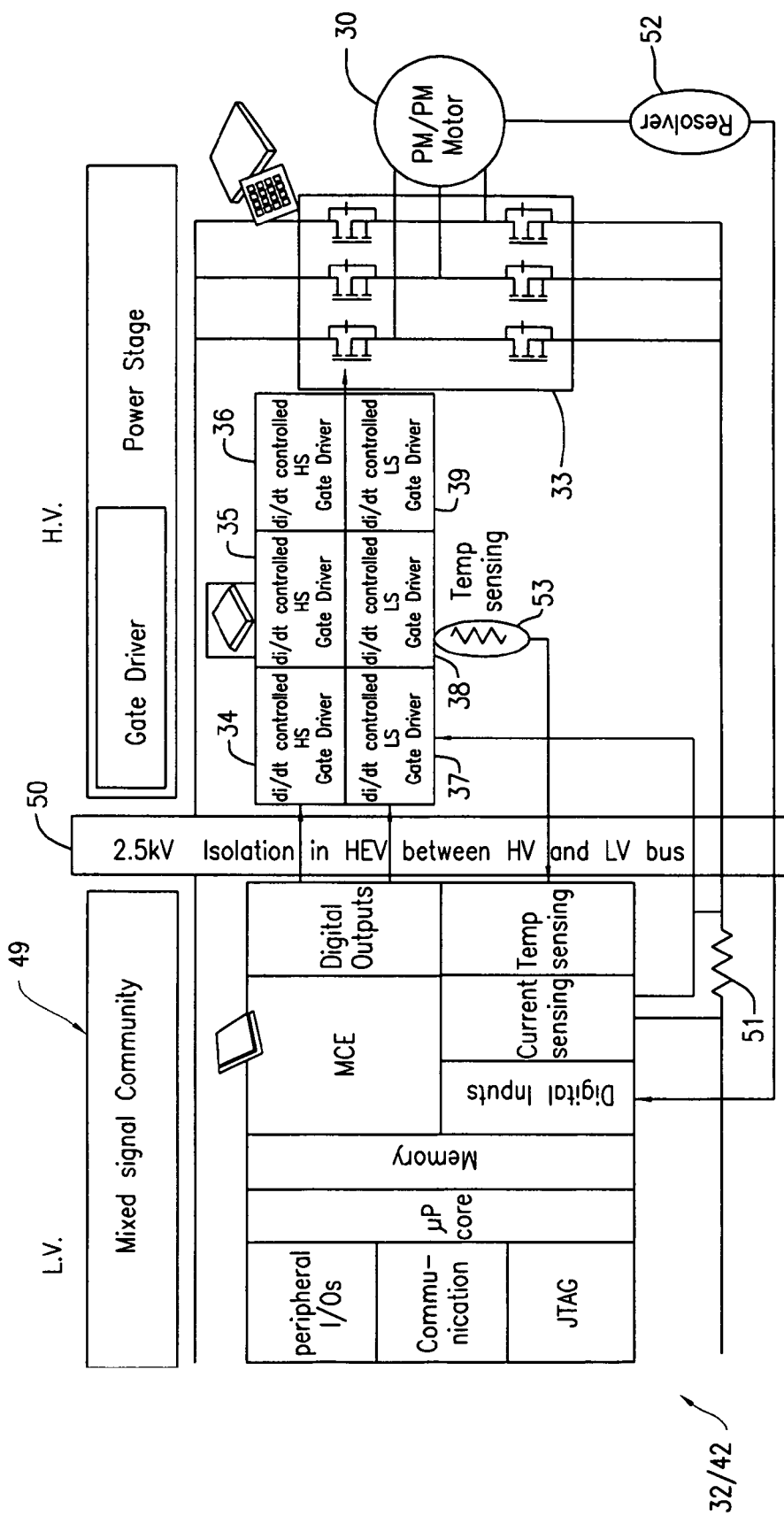
FIG. 2 shows the system of FIG. 1 in further detail to include the ECU in the LV circuit, and shows the prior art isolation barrier between the LV and HV sections or nets.
Figure 3:
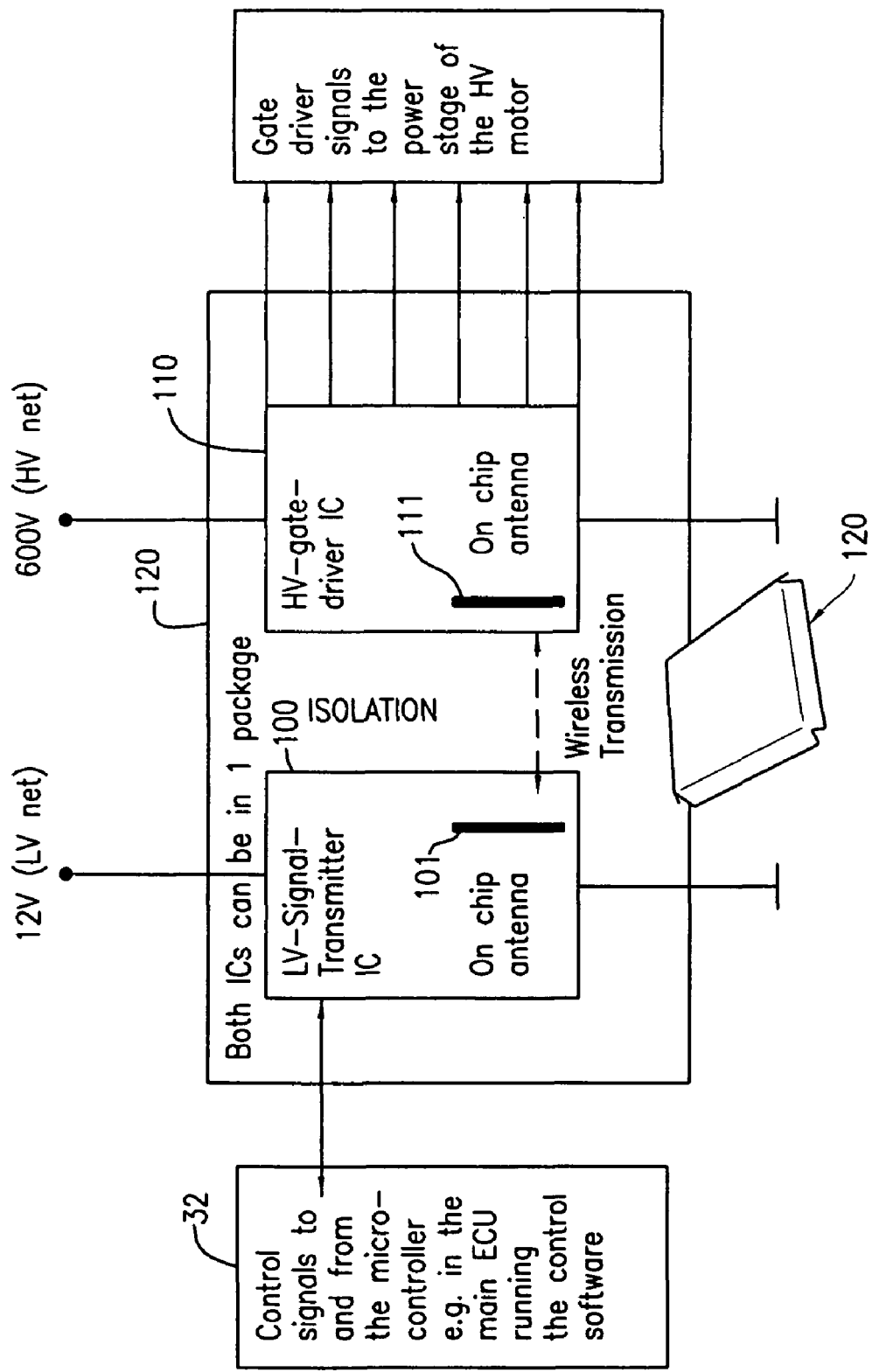
FIG. 3 shows an RF device disclosed in copending application Ser. No. 12/009,721 (IR-3522) in which an LV signal transmitter IC and HV gate driver IC are used for the isolation barrier and are copacked in a common package and are in wireless communication.

Referring first to FIG. 3, which shows the structure of copending application Ser. No. 12/009,721 (IR-3522), there is shown a first semiconductor IC chip 100 which is the LV signal transmitter IC of FIG. 2, adapted however with an on chip antenna 101. Control signals from control circuit 32/49 of FIG. 2 in the 12 volt network running the control software drives IC 100 which would be the left hand side of barrier 50 in FIG. 2. A spaced HV gate driver IC 110 also having an on-chip antenna 111 is spaced from IC by a distance of, for example, 5 millimeters or as needed to provide the full isolation between the LV and HV networks and would be on the right hand side of barrier 50 in FIG. 2. The IC 110 then provides the necessary gate driver signals to the power stage of the HV motor 30, for example, drivers 34 to 39 of FIG. 2 the current and temperature sensors and the like. The barrier 50 of FIG. 2 then consists of the physical gap between ICs 100 and 110, which is traversed by the wireless transmission between the two ICs.

The ICs 100 and 110 can be co-packed in a common plastic housing or package 120 as shown in FIG. 3 and are insulated from one another by the package plastic or dielectric. Thus, in the assembly of FIG. 3, communication between ICS 100 and 110 is wireless over a very short distance. Isolation is provided by the mechanical spacing and the dielectric material between the two chips.

Figure 1:
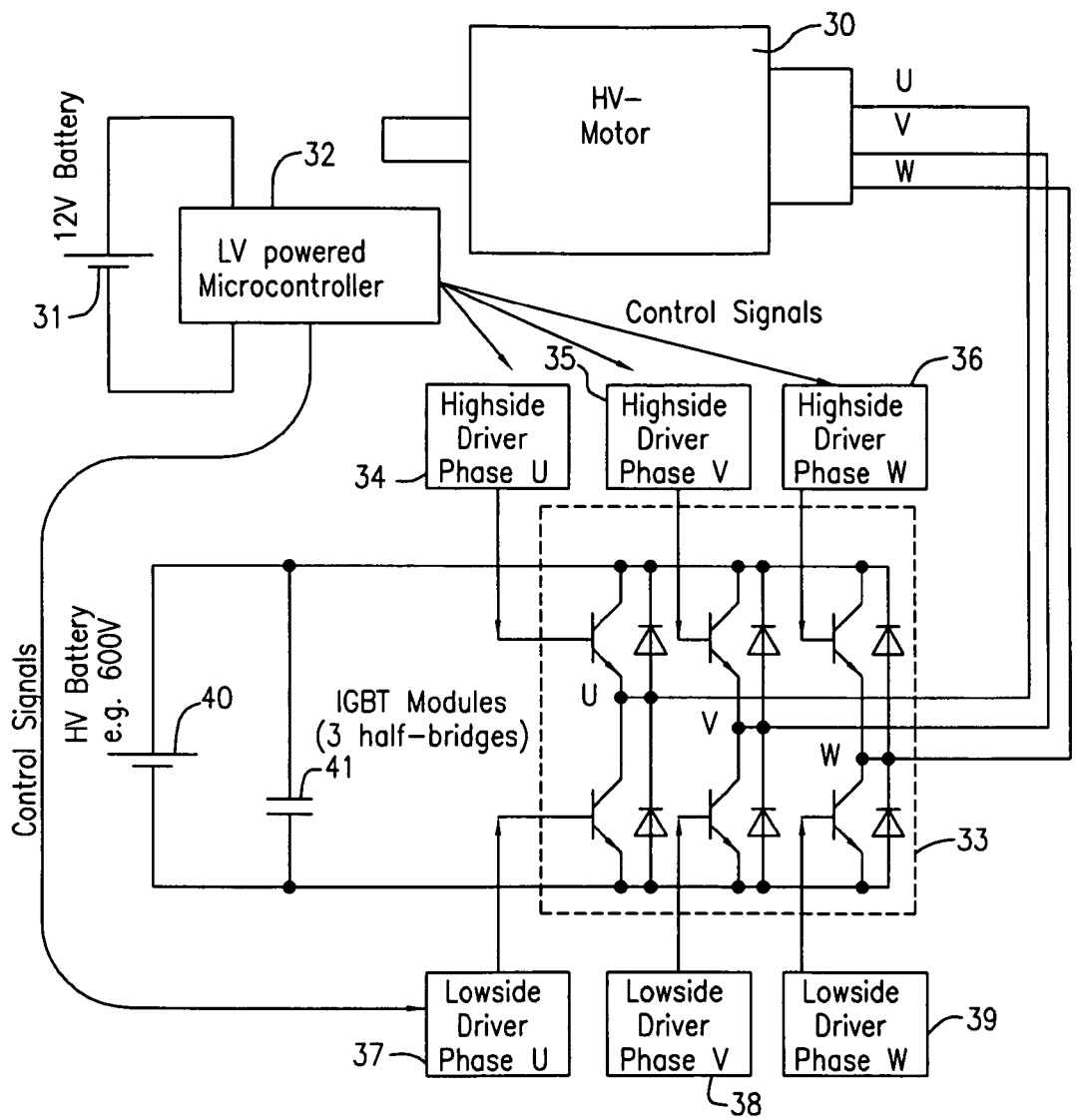
FIG. 1 schematically shows a known typical E motor drive system with HV and LV power networks.
Figure 4:
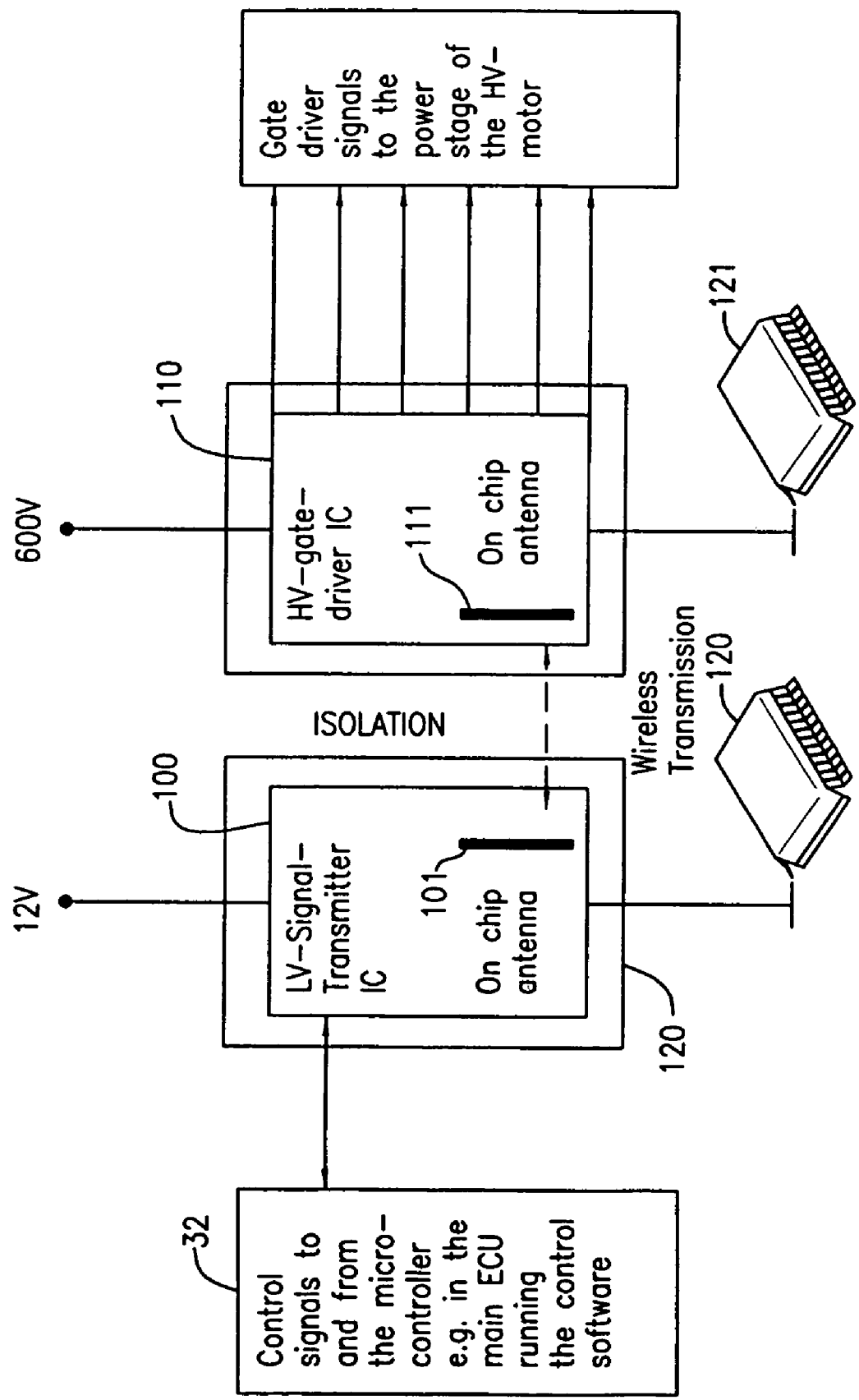
FIG. 4 shows another embodiment of application Ser. No. 12/009,721 (IR-3522) in which the LV signal transmitter IC and the HV gate driver IC are in separated respective packages.

FIG. 4 shows a further embodiment of the RF coupler of copending application Ser. No. 12/009,721 (IR-3522) invention in which LV signal transmitter IC chip 100 and HV gate driver IC chip 110 are separately housed in packages 120 and 121 respectively. The communication between the ICs is again wireless and isolation is provided by the mechanical distance between ICs 100 and 110. Again, the LV signal transmitter IC 100 is electrically connected to the 12V power supply and to microcontroller unit and to the main ECU 32/49 which are part of the 12V system. The HV driver IC 110 is directly connected to the power stage (e.g. IGBTs, MOSFETs, temperature and current sensors and the like) driving E-motor 30 of FIG. 1. The communication between ICs 100 and 110 is again wireless over a very short distance by mounting the two components next to each other but suitably spaced, as on a printed circuit board.

If desired, the 2 ICs 100 and 110 may be unhoused bare die mounted directly on a common substrate such as FR4, DBC, IMS or the like and spaced from and insulated from one another by a suitable lateral spacing to provide the necessary isolation.

Figure 5:
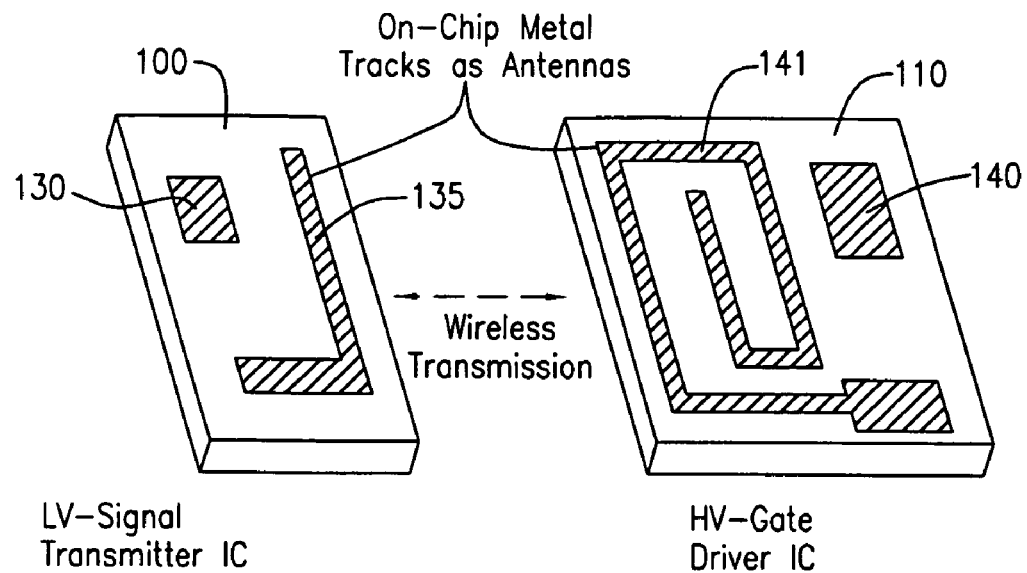
FIG. 5 shows the 2 ICS of FIGS. 3 and 4 with on-chip metal traces within their respective chip or die forming the antenna structures.

FIG. 5 shows a further embodiment of the RF coupler of application Ser. No. 12/009,721 (IR-3522) in which the antenna structures are formed in a metal layer which may be otherwise used in the process employed to manufacture the IC. Thus, a metal layer in the silicon, GaN or other process to make chip 100 may be etched to form plural electrodes, including, for example, electrode 130 (for any IC purpose). At the same time, a suitable masking pattern can define antenna 135.

Similarly, for IC 110, the process which defines top exposed electrode 140 in chip or die 110 also defines antenna 141.

Figure 6:
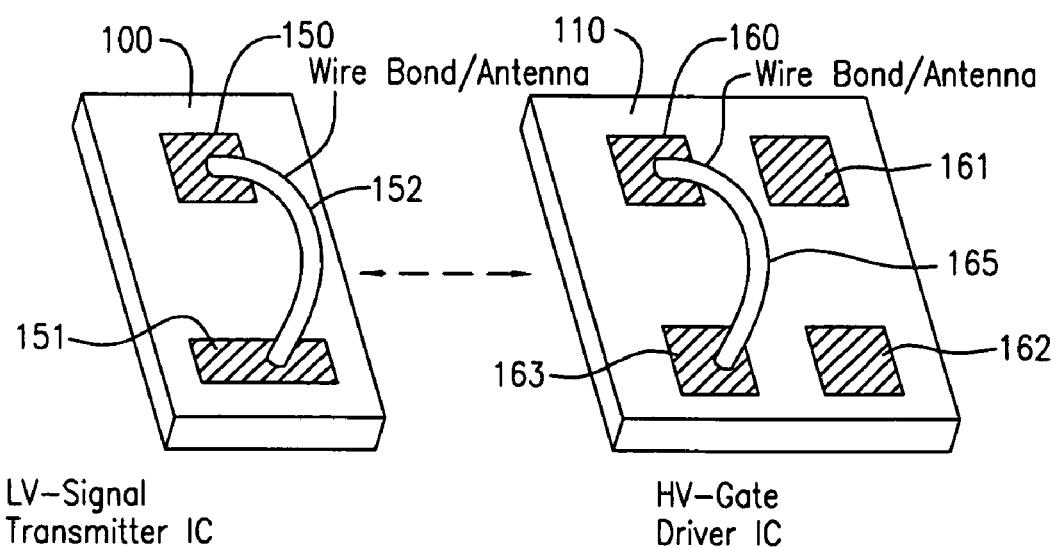
FIG. 6 shows the 2 ICS of FIGS. 3 and 4 with on-chip wire bonds serving as the antennas for their wireless communication.

FIG. 6 shows a further embodiment of chips 100 and 110 of FIGS. 3, 4 and 5 in which chip 100 has electrodes 150, 151 which are connected by an outwardly looped wire bond 152 which may serve as the antenna for chip 100. Similarly, chip 110 has metal electrodes 160, 161, 162 and 163 and a wire bond 165 between electrodes 160 and 163 which serves as its antenna which communicates with antenna 152.

In FIGS. 5 and 6, the chips 100 and 110 may be bare chips closely mounted on a common substrate or may be individually packaged or copacked as previously described.

In each of the above embodiments, the gate driver IC 100 may have additional smart functions including those in smart gate driver products such as the IR2114, IR2214 parts of International Rectifier Corporation with motor protection circuits, soft shut down functions, etc. . . .

Any combination of several LV transmitter ICs and several HV driver ICs can also be used to form a communication network with isolation.

In addition one HV driver IC 110 can exchange signals with two or more LV transmitter ICs 100, or vice versa, one LV transmitter IC 100 can communicate with two or more HV driver ICs. Note that only e.g., one LV transmitter can communicate with all 3 half bridge driver ICs for the 3 phases of a motor power stage.

Further, in FIGS. 3 to 6, plural HV driver ICs 110 may take advantage of the wireless communication capability to exchange signals and information among each other via their antennas. Thus, one half bridge driver may recognize a fault situation in its phase and send this status flag signal via its antenna to the other two half bridge drivers which are mounted in close proximity to each other. Similarly, different LV driver ICs 100 may communicate with each other via their antennas. Therefore, the wireless communication capability allows simplification of the main electric circuitry withing the LV or HV circuitry since the various ICs can "talk to" each other without the need for a physical electric connection on their support PCBs.

In accordance with the improvement of the invention, the RF communication of FIGS. 3 to 6 is implemented by the capacitive coupling of the LV and HV sections through an insulation or dielectric layer between the two.

Figure 7:
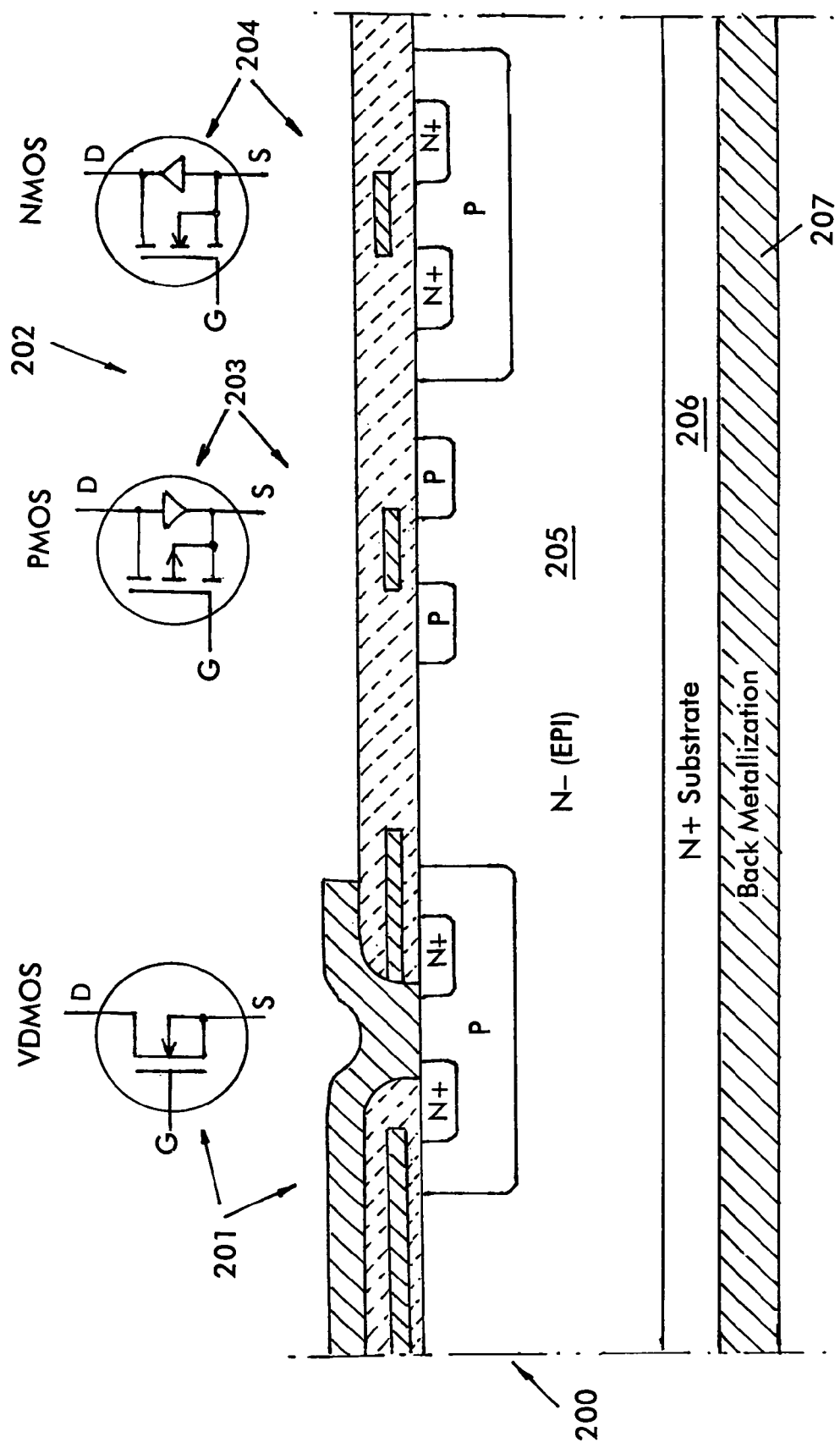
FIG. 7 shows, in schematic cross-section, an LV input IC chip which can be used as the input section of a combination of HV and LV isolated sections of a control in accordance with the invention.

FIG. 7 shows, in schematic form, a cross-section of a typical LV input device 200 which provides, in a single chip, a vertical DMOS section 201 and a CMOS section 202, which includes a PMOS segment 203 and an NMOS section 204 built into the common N− epitaxial layer 205. The epitaxial layer (epi) 205 is deposited atop an N+ substrate 206 which, in turn, receives a back metal 207. Inputs to the VDMOS gates and CMOS gates are taken from the LV mixed signal controller 32/42/49 of FIG. 2 and biasing voltages for the sources and drains are taken from the low voltage net in FIG. 1.

The chip 200 will have all desired integrated smart IC functionality and is suitably designed to form the LV input device of the invention. The active back metal 207 will be charged and discharged via the vertical DMOS section 201.

Figure 8:
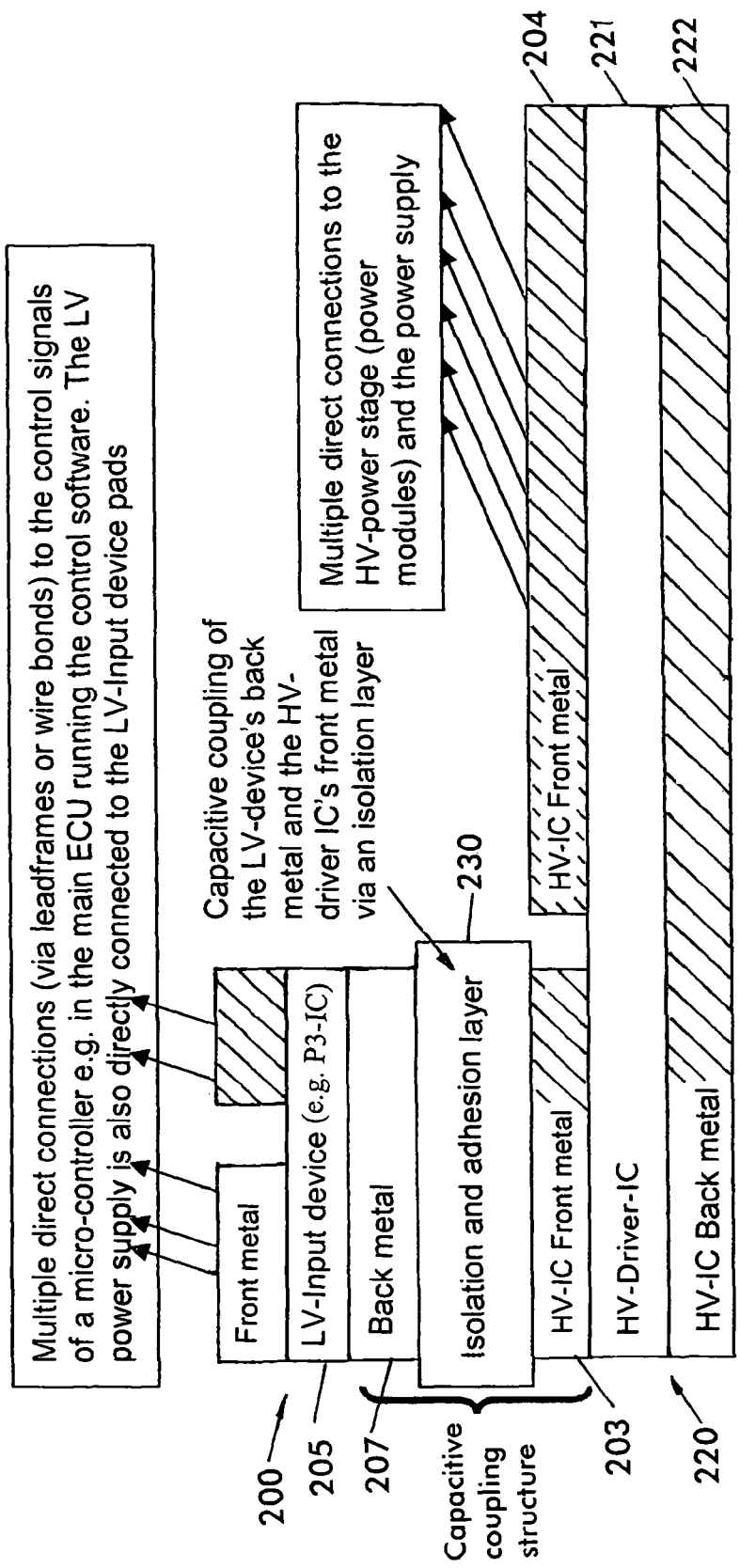
FIG. 8 shows, in schematic cross-section, the LV input chip of FIG. 7 mounted atop and isolated from and capacitively coupled to an HV driver IC.

The CMOS section 202 offers the necessary logic gates to control vertical current flow in section 201 to the active back metal 207. The back metal potential will then form one half of a capacitive coupling element according to the invention as shown in FIG. 8. Multiple direct connection wire lead frames or wire bonds are connected to suitable pads on the front surface of chip 200 from the main ECU running the control software (FIG. 2).

Figures 9, 10:
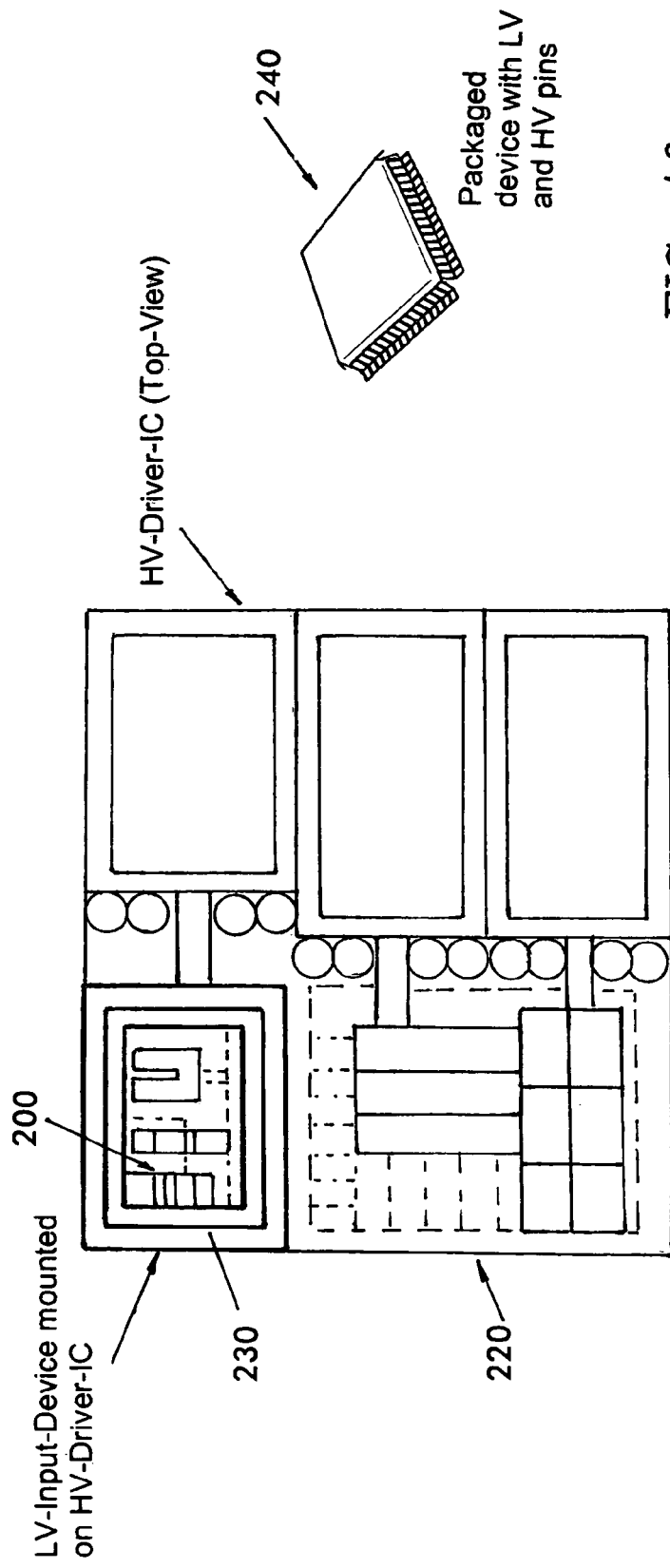
FIG. 9 is a top plan view of the LV input device of FIGS. 7 and 8 mounted atop the HV driver IC of FIG. 8.
FIG. 10 is a perspective view of the packaged IC of FIG. 9.

FIGS. 8 and 9 show the LV input device or chip 200 of FIG. 7 mounted atop an HV driver chip 220. The HV driver chip 220 is basically a known type of IC driver and is an IC chip 221 having a back metal 222 and front metal segments 203, 204. The LV input chip 200 is connected to HV front metal segment 203 by an isolation and adhesive layer 230 which can have the necessary voltage isolation characteristics to provide full isolation between the LV and HV net. Layer 230 need be only a few millimeters thick to achieve isolation values greater than about 2000 volts. The back metal 207, isolation layer 230 and front metal section 203 constitute a capacitive coupling structure for coupling the output of LV input chip to the related input terminals of the HV driver IC 221.

The schematically illustrated front metal 204 will constitute a large number of segments connected to output pins to produce multiple direct connections to the HV power stage and to the HV power supply net of FIG. 2.

The assembly of FIGS. 8 and 9 may be suitable packaged, as shown by package 240 in FIG. 10. Other types of packages, such as SOIC or Multileadframe Packages (MLP) can also be used.

Thus, in accordance with the invention, the HV driver IC is directly connected to the HV power supply and to the switches of the power stage of the E motor 30 and to sensors of current, temperature, current and the like as shown in FIG. 2. The chip-on-chip is packaged in the single package 240 (FIG. 10) which provides all of the lead frame pins to the LV circuitry for the LV input device 200 and to the HV circuitry for the HV driver IC 220.

FIGS. 8 and 9 show only one LV input device 200 mounted on and capacitively isolated coupled to only one HV driver IC 220. However, more than one LV input device can be laterally spaced from and mounted on a common HV device IC 220.

The insulation layer 230 of FIGS. 8 and 9 is shown as a uniform layer of a high dielectric material. However, composites of layers of diverse materials to optimize characteristics of isolation, stress, adhesion and the like can be used.

By choosing particular material properties, the isolation layer 230 can also be used to minimize the mechanical stress between the two silicon or other material dies 200 and 220 while establishing a reliable rugged mounting strength.

The top metal layer 203 of the HV driver IC 220 can be used to detect the potential of the LV input device back metal 207. Thus, instead of a metal plate any field effect influenced by the back metal potential of the LV input device can be used in the HV driver IC to established the desired capacitive coupling.

The back metal 207 of the LV input device 200 can be used similar to an isolated gate-electrode in order to impact, for example, the electron density in a certain region of the HV driver IC 220.

Also, according to the invention the LV input device 200 can use eddy current induction in the HV driver IC 220 to transfer a contact-less signal via the isolation layer 230 and vice versa.

Further, instead of packaging the chip-on-chip ICs as in FIG. 10, the IC-stack can be directly mounted as bare die, stacked on a suitable substrate such as FR4, DBC, IMS, or other suitable die mounting substrates.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. In a motor drive system comprising a low voltage net having a low voltage source, an electronic controller connected to said low voltage source for producing control signals for controlling the operation of a motor in said motor drive system, and a high voltage power stage including a high voltage source for controllably applying power to said motor drive system, said high voltage power stage including gated semiconductor switch devices for controllably connecting high voltage power from said high voltage source to said motor;

a low voltage first signal transmitter IC chip having an input coupled to said electronic controller and having an output electrode for producing signals containing information related to the output of said electronic controller;

a high voltage second gate driver IC having an output electrode connected to said gated semiconductor switch devices and having an input electrode for receiving control signals from said output electrode of said low voltage IC chip as an input; and an isolation dielectric layer fixed between said output electrode of said low voltage IC and said input electrode of said high voltage IC for capacitively coupling signals from said low voltage input chip to said high voltage driver chip;

said first and second chips being physically spaced from one another by the thickness of said isolation dielectric layer;

said thickness being sufficient to define an isolation barrier between said low voltage net and said high voltage power stage.

2. The system of claim 1, wherein said low voltage source is a 12 volt battery and said high voltage source is a battery having a voltage greater than about 100 volts.

3. The system of claim 1, wherein said isolation barrier is sufficient to insulate against a voltage of about twice that of said high voltage source plus 1 kV.

4. The system of claim 2, wherein said isolation barrier is sufficient to insulate against a voltage of about twice that of said high voltage source plus 1 kV.

5. The system of claim 2, wherein said motor comprises a multiphase a-c motor and said power stage includes a multiphase inverter for converting the voltage of said high voltage source battery to a multiphase voltage connected to said motor.

6. The system of claim 1, wherein said first and second chips are copacked and insulated from one another within a common insulation housing.

7. An electrical drive system comprising:
   an electronic controller in a low voltage system and configured to control an electric motor in a high voltage system using control signals;
   a low voltage transmitter IC chip to transmit said control signals from said electronic controller to a high voltage driver IC chip coupled to a high voltage power stage, said high voltage power stage configured to controllably connect high voltage power from said high voltage system to said electric motor;
   said low voltage transmitter IC chip mounted on said high voltage driver IC chip to transmit said control signals using capacitive coupling formed by an isolation layer disposed between an electrode of said low voltage transmitter IC chip and an electrode of said high voltage driver IC chip.

8. The system of claim 7, wherein said electric motor comprises a multiphase a-c motor and said high voltage power stage includes a multiphase inverter for converting the voltage of a high voltage source to a multiphase voltage connected to said electric motor.

9. The system of claim 7, wherein said high voltage power stage comprises gated semiconductor switch devices to be driven by said high voltage driver IC chip.

10. The system of claim 7, wherein said high voltage driver IC chip is configured to provide status feedback and diagnostics from said electric motor to said electronic controller.

11. The system of claim 7, wherein said low voltage system comprises a 12 volt system and said high voltage system comprises a. greater than 100 volt system.

12. An electrical drive system comprising:
   an electronic controller in a low voltage system and configured to control a high voltage component in a high voltage system using control signals;
   a low voltage transmitter IC chip to transmit said control signals from said electronic controller to a high voltage driver IC chip coupled to said high voltage component;
   said low voltage transmitter IC chip mounted on said high voltage driver IC chip to transmit said control signals using capacitive coupling formed by an isolation layer disposed between an electrode of said low voltage transmitter IC chip and an electrode of said high voltage driver IC chip.

13. The system of claim 12, wherein said high voltage component comprises an electric motor.

14. The system of claim 12, wherein said electronic controller is coupled to a plurality of front electrodes of said low power transmitter chip to transmit said control signals.

15. The system of claim 12, comprising a plurality of low voltage transmitter IC chips mounted on said high voltage driver IC chip.

16. The system of claim 12, wherein said electrode of said low voltage transmitter IC chip comprises a back metal.

17. The system claim 12, wherein said electrode of said high voltage driver IC chip comprises a front metal segment.

18. The system of claim 12, wherein said high voltage driver IC chip comprises a plurality of front metal segments to couple to said high voltage system.

19. The system of claim 12, wherein said low voltage system comprises a 12 volt system and said high voltage system comprises a greater than 100 volt system.

20. The system of claim 12, wherein said isolation layer is sufficient to insulate against a voltage of about twice that of said high voltage system plus 1 kV.

* * * * *

UNITED STATES PATENT AND TRADEMARK OFFICE
CERTIFICATE OF CORRECTION

| | | |
|---|---|---|
| PATENT NO. | : 7,834,575 B2 | Page 1 of 1 |
| APPLICATION NO. | : 12/080176 | |
| DATED | : November 16, 2010 | |
| INVENTOR(S) | : Henning M. Hauenstein | |

It is certified that error appears in the above-identified patent and that said Letters Patent is hereby corrected as shown below:

In the claims, column 10, line 3, "a." should be changed to --a--.

Signed and Sealed this
Sixth Day of December, 2011

David J. Kappos
*Director of the United States Patent and Trademark Office*